(12) United States Patent
Godet et al.

(10) Patent No.: US 9,620,407 B2
(45) Date of Patent: Apr. 11, 2017

(54) 3D MATERIAL MODIFICATION FOR ADVANCED PROCESSING

(71) Applicant: Applied Materials, Inc., Santa Clara, CA (US)

(72) Inventors: Ludovic Godet, Sunnyvale, CA (US); Srinivas D. Nemani, Sunnyvale, CA (US); Erica Chen, Cupertino, CA (US); Jun Xue, San Jose, CA (US); Ellie Y. Yieh, San Jose, CA (US); Gary E. Dickerson, Gloucester, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 28 days.

(21) Appl. No.: 14/613,545

(22) Filed: Feb. 4, 2015

(65) Prior Publication Data

US 2016/0163546 A1 Jun. 9, 2016

Related U.S. Application Data

(60) Provisional application No. 62/089,081, filed on Dec. 8, 2014.

(51) Int. Cl.

| | |
|---|---|
| *H01L 21/762* | (2006.01) |
| *H01L 21/84* | (2006.01) |
| *H01L 21/82* | (2006.01) |
| *H01L 27/092* | (2006.01) |
| *H01L 21/311* | (2006.01) |

(Continued)

(52) U.S. Cl.
CPC ...... *H01L 21/7624* (2013.01); *H01L 21/0337* (2013.01); *H01L 21/31111* (2013.01); *H01L 21/31116* (2013.01); *H01L 21/31155* (2013.01); *H01L 21/32* (2013.01); *H01L 21/76205* (2013.01); *H01L 21/823431* (2013.01); *H01L 21/823821* (2013.01); *H01L 21/845* (2013.01);

(Continued)

(58) Field of Classification Search
CPC .......... H01L 29/66803; H01L 21/3086; H01L 21/302; H01L 21/0337; H01L 23/564; H01L 21/7624; H01L 21/845; H01L 21/31155; H01L 21/31111; H01L 21/31116; H01L 21/823431; H01L 21/823821; H01L 27/0886; H01L 27/0924
See application file for complete search history.

(56) References Cited

U.S. PATENT DOCUMENTS

| | | |
|---|---|---|
| 6,974,983 B1 | 12/2005 | Hill et al. |
| 7,384,838 B2 | 6/2008 | Hsu et al. |

(Continued)

*Primary Examiner* — Thanhha Pham
(74) *Attorney, Agent, or Firm* — Patterson+Sheridan, LLP

(57) ABSTRACT

Embodiments of the present disclosure relate to precision material modification of three dimensional (3D) features or advanced processing techniques. Directional ion implantation methods are utilized to selectively modify desired regions of a material layer to improve etch characteristics of the modified material. For example, a modified region of a material layer may exhibit improved etch selectivity relative to an unmodified region of the material layer. Methods described herein are useful for manufacturing 3D hardmasks which may be advantageously utilized in various integration schemes, such as fin isolation and gate-all-around, among others. Multiple directional ion implantation processes may also be utilized to form dopant gradient profiles within a modified layer to further influence etching processes.

16 Claims, 6 Drawing Sheets

(51) Int. Cl.
- *H01L 21/8234* (2006.01)
- *H01L 27/088* (2006.01)
- *H01L 21/033* (2006.01)
- *H01L 21/8238* (2006.01)
- *H01L 21/3115* (2006.01)
- *H01L 21/32* (2006.01)

(52) U.S. Cl.
CPC ...... *H01L 27/0886* (2013.01); *H01L 27/0924* (2013.01)

(56) References Cited

U.S. PATENT DOCUMENTS

| | | |
|---|---|---|
| 7,494,862 B2 | 2/2009 | Doyle et al. |
| 8,021,949 B2 | 9/2011 | Cheng et al. |
| 8,263,446 B2 | 9/2012 | Cheng et al. |
| 2013/0102137 A1 | 4/2013 | Jeng |
| 2014/0131801 A1 | 5/2014 | Basker et al. |
| 2016/0013183 A1* | 1/2016 | Basker ............... H01L 27/0886 257/401 |

* cited by examiner

3D MATERIAL MODIFICATION FOR ADVANCED PROCESSING

CROSS-REFERENCE TO RELATED APPLICATIONS

This application claims benefit to U.S. provisional patent application No. 62/089,081, filed Dec. 8, 2014, which is herein incorporated by reference in its entirety.

BACKGROUND

Field

Embodiments of the present disclosure generally relate to methods and device structures which may be utilized in advanced patterning schemes. More specifically, embodiments described herein relate to three dimensional (3D) material modification for advanced processing methods.

Description of the Related Art

In response to an increased need for smaller electronic devices with denser circuits, devices with three dimensional (3D) structures have been developed. An example of such devices may include FinFETs having conductive fin-like structures that are raised vertically above a horizontally extending substrate. Conventional FinFETs may be formed on a substrate, such as a semiconducting substrate or silicon-on-insulator (SOI). The substrate may comprise a semiconducting substrate and an oxide layer disposed on the semiconducting substrate.

In light of the continued demand for continually smaller devices, various integration and advanced patterning schemes have been proposed. Examples of advanced applications include fin isolation, gate-all-around and 3D capping, among others. These 3D integration schemes generally demand precise processing capabilities which are operable at increasingly reduced technology nodes. For example, 3D hardmasks are often required to protect fin structures. However, various challenges arise in the manufacture of such features. Etch selectivity often limits the usefulness of many conventional hardmask formation processes and conventional processing schemes may lack the ability to be implemented efficiently and economically at advanced technology nodes.

Thus, what is needed are improved 3D processing methods and device structures.

SUMMARY

In one embodiment, a method of manufacturing a 3D hardmask is provided. The method includes depositing a film on a substrate having one or more fin structures formed thereon and selecting an ion implantation angle in response to an aspect ratio defined by the one or more fin structures. An ion dosage concentration and implantation energy may be selected and configured to modify compositional characteristics of the film and an implantation temperature may also be selected. Ions may be accelerated toward the film along the angle and bombard at least one surface of the film with the ions to form a modified portion of the film. An unmodified portion of the film may also be removed from the substrate.

In another embodiment, a method of manufacturing a 3D hardmask is provided. The method includes depositing a silicon nitride film on a silicon substrate having one or more fin structures formed thereon and selecting an ion implantation angle in response to an aspect ratio defined by the one or more fin structures. An ion dosage concentration greater than about 5E15 (ions/cm$^3$) and an implantation energy may be selected and configured to modify compositional characteristics of the film and an implantation temperature of between about 15° C. and about 400° C. may also be selected. Ions may be accelerated toward the film along the angle and bombard sidewalls and a top surface of the film with the ions to form a modified cap portion of the film. An unmodified portion of the film may be etched from the substrate using a fluorine containing etching process and exposed surfaces of the substrate and fin structures may be oxidized.

In yet another embodiment, a 3D hardmask structure is provided. The 3D hardmask structure includes a modified film layer disposed on a fin structure. The modified film layer may have a top portion disposed over the fin structure and sidewall portions that extend adjacent to sidewalls of the fin structure. The modified film layer may further include an outer region having a first dopant concentration, an intermediate region having a second dopant concentration less than the first dopant concentration and an inner region having a third dopant concentration less than the second dopant concentration.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to material modification of three dimensional (3D) features for advanced processing techniques. Directional ion implantation methods may be utilized to selectively modify desired regions of a material layer to improve etch characteristics of the modified material. For example, a modified region of a material layer may exhibit improved etch selectivity relative to an unmodified region of the material layer. Methods described herein may be useful for manufacturing 3D hardmasks which may be advantageously utilized in various integration schemes, such as fin isolation and gate-all-around, among others. Multiple directional ion implantation processes may also be utilized to form dopant gradient profiles within a modified layer to further influence etching processes.

The utilization of directional ion implantation methods described herein modify film properties to advantageously affect an etching rate of the film. More specifically, localized etching rates within a specific region of a film may be modified to selectively remove a desired portion of the film relative to unmodified regions of the film. In addition, ion species and film material selection may be tailored to provide more precise etching characteristics. Various other processing parameters, such as implantation angle and temperature, may enhance selective etching processes and may be suitable for utilization in advanced integration schemes.

Figure 1A:
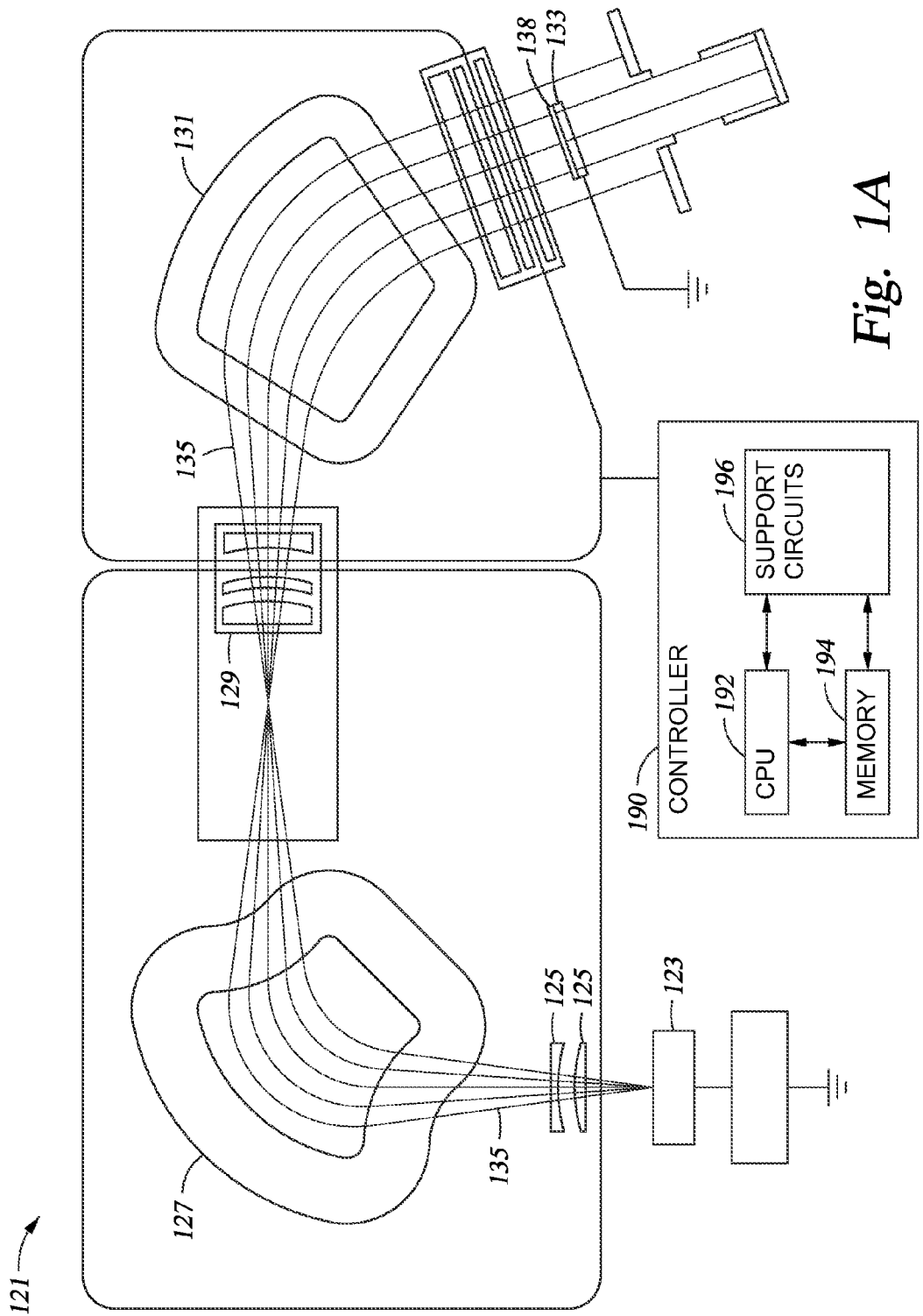
FIG. 1A illustrates a schematic diagram of a directional implantation apparatus useful to perform the methods described herein.

FIG. 1A illustrates a schematic diagram of a processing apparatus 121 useful to perform processes described herein. One example of a beam-line ion implantation apparatus is the Varian VIISTA® Trident, available from Applied Materials, Inc., Santa Clara, Calif. The processing apparatus 121 is representative of a beam-line ion implantation apparatus. In addition to the apparatus 121 described below and the apparatus 100 described with regard to FIG. 1B, other ion implantation apparatuses, such as plasma immersion ion implantation apparatus or plasma assisted doping apparatus, may be used to perform the methods described herein.

The processing apparatus 121 may include an ion source 123 for generating ions. The processing apparatus 121 may also include a series of beam-line components. Examples of beam-line components may include extraction electrodes 125, a magnetic mass analyzer 127, a plurality of lenses 129, and a beam parallelizer 131. The processing apparatus 121 may also include a platen 133 for supporting a substrate 138 to be processed. The substrate 138 may be moved in one or more dimensions (e.g. translate, rotate, tilt, etc.) by a component sometimes referred to as a "roplat" (not shown). It is also contemplated that the processing apparatus 121 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 123. Thereafter, the extracted ions 135 travel in a beam-like state along the beam-line components and may be implanted in the substrate 138. Similar to a series of optical lenses that manipulate a light beam, the beam-line components manipulate the extracted ions 135 along the ion beam. In such a manner, the extracted ions 135 are manipulated by the beam-line components while the extracted ions 135 are directed toward the substrate 138. It is contemplated that the apparatus 121 may provide for improved mass selection to implant desired ions while reducing the probability of undesirable ions (impurities) being implanted in the substrate 138.

The above-described processing apparatus 121 can be controlled by a processor based system controller such a controller 190. For example, the controller 190 may be configured to control beam-line components and processing parameters associated with beam-line ion implantation processes. The controller 190 includes a programmable central processing unit (CPU) 192 that is operable with a memory 194 and a mass storage device, an input control unit, and a display unit (not shown), such as power supplies, clocks, cache, input/output (I/O) circuits, and the like, coupled to the various components of the processing apparatus 121 to facilitate control of the substrate processing. The controller 190 also includes hardware for monitoring substrate processing through sensors in the processing apparatus 121, including sensors monitoring the substrate position and sensors configured to receive feedback from and control heating apparatus coupled to the processing apparatus 121. Other sensors that measure system parameters such as substrate temperature and the like, may also provide information to the controller 190.

To facilitate control of the processing apparatus 121 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Implantation and other processes are generally stored in the memory 194, typically as a software routine. The software routine may also be stored and/or executed by a second CPU (not shown) that is remotely located from the hardware being controlled by the CPU 192.

The memory 194 is in the form of computer-readable storage media that contains instructions, that when executed by the CPU 192, facilitates the operation of the apparatus 121. The instructions in the memory 194 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 1B:
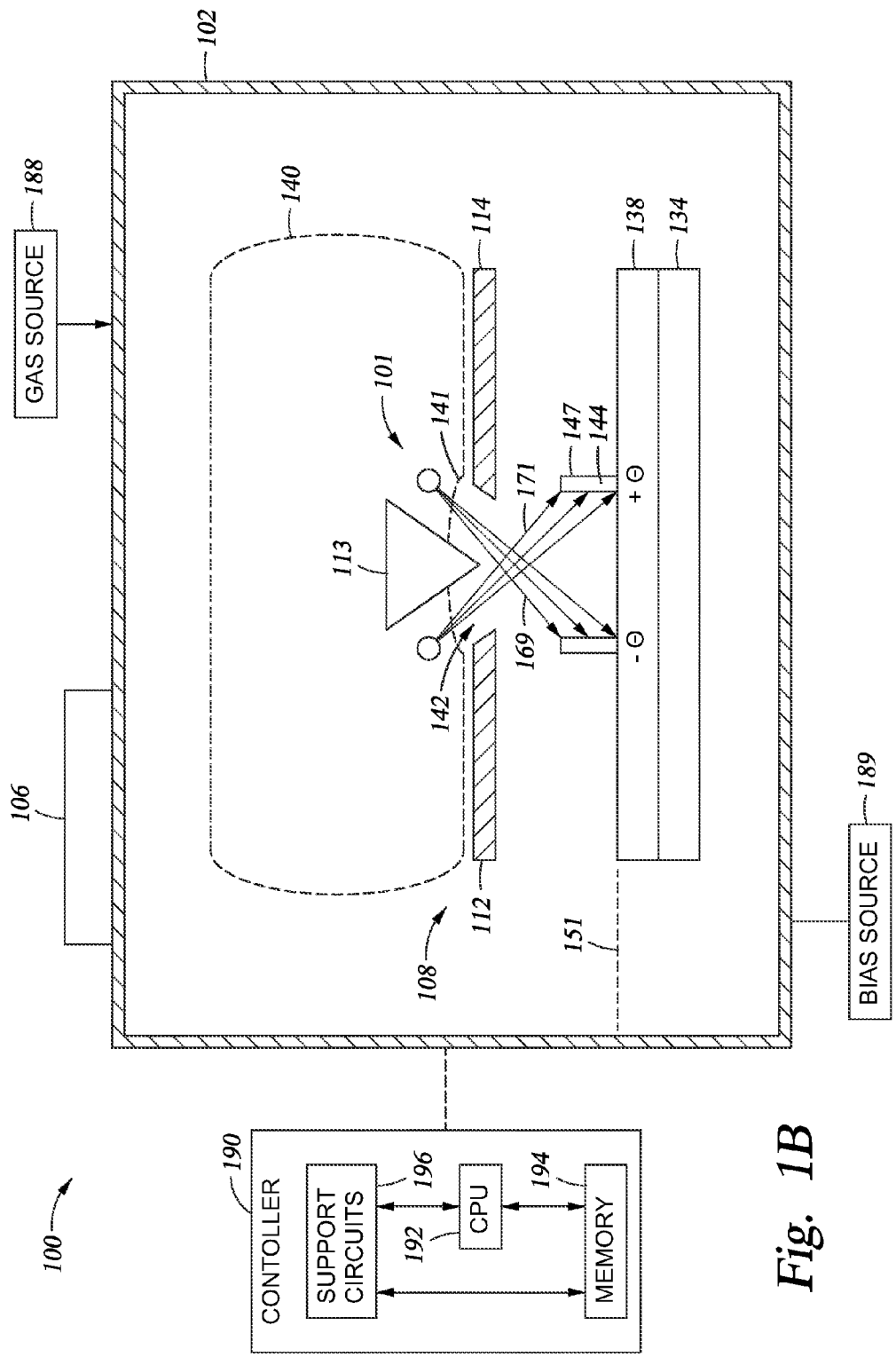
FIG. 1B illustrates a schematic diagram of a directional implantation apparatus useful to perform the methods described herein.

FIG. 1B illustrates a schematic diagram of another processing apparatus 100 useful to perform processes described herein. The plasma processing apparatus 100 is representative of a bi-directional plasma implantation apparatus and the plasma processing apparatus 100 includes a process chamber 102, a platen 134, a source 106, and a modifying element 108. The platen 134 may be positioned in the processing chamber 102 for supporting the substrate 138.

The platen 134 may be coupled to an actuator (not shown) which may cause the platen 134 to move in a scanning motion. The scanning motion may be a back and forth movement within a single plane which may be substantially parallel to the modifying element 108. The source 106 is configured to generate the plasma 140 in the process chamber 102. The modifying element 108 includes a pair of insulators 112, 114 which may define a gap therebetween having a horizontal spacing (G). The insulators 112, 114 may comprise an insulating material, a semi-conducting material, or a conductive material. The modifying element 108 also includes a directional element 113 disposed in a position relative to the insulators 112, 114 to define a directional pathway for ion 101 delivered toward the substrate 138.

In operation, a gas source 188 may supply an ionizable gas to the process chamber 102. Examples of an ionizable gas may include $BF_3$, $BI_3$, $N_2$, Ar, $PH_3$, $AsH_3$, $B_2H_6$, $H_2$, Xe, Kr, Ne, He, $CHF_3$, $C_2F_6$, $CH_4$, $CF_4$, $CO_2$, $AsF_5$, Carborane, $PF_3$ and $PF_5$, among others. More specifically, species of ions may include He+, $H_3$+, $H_2$+, H+, Ne+, F+, C+, $CF_x$+, $CH_x$+, $C_xH_y$, N+, B+, $BF_2$+, $B_2H_x$+, Xe+ and molecular carbon, boron, or boron carbide ions. The source 106 may generate the plasma 140 by exciting and ionizing the gas provided to the process chamber 102. The ions 101 are attracted from the plasma 140 across the plasma sheath 142. For example, a bias source 189 is configured to bias the substrate 138 to attract the ions 101 from the plasma 140 across the plasma sheath 142. The bias source 189 may be a DC power supply to provide a DC voltage bias signal or an RF power supply to provide an RF bias signal.

The modifying element 108 modifies the electric field within the plasma sheath 142 to control a shape of the boundary 141 between the plasma 140 and the plasma sheath 142. The modifying element 108 includes the insulators 112, 114 and directional element 113. The insulators 112, 114 and directional element 113 may be fabricated from materials such as quartz, alumina, boron nitride, glass, silicon nitride, silicon, silicon carbide, doped silicon, graphite, and other suitable materials. The boundary 141 between the plasma 140 and the plasma sheath 142 is dependent upon the placement of the directional element 113 relative to the insulators 112, 114 as the directional element 113 may alter the electric field within the plasma sheath 142.

Ions following a trajectory path 171 may strike the substrate 138 at about an angle of $+\theta$ normal to the plane 151. Ions following trajectory path 169 may strike the substrate 138 at an angle of about $-\theta$ normal to the plane 151. Accordingly, the range of incident angles normal to the plane 151 may be between about $+1°$ and about $+89°$ and between about $-1°$ and about $-89°$, excluding $0°$. For example, a first range of incident angles normal to the plane 151 may be between about $+30°$ and about $+80°$ and a second range of incident angles may be between about $-30°$ and about $-80°$. In one embodiment, the first range of incident angles relative to the plane 151 may be between about $-40°$ and about $-70°$ and the second range of incident angles relative to the plane 151 may be between about $+40°$ and about $+70°$. In addition, some ion trajectories, such as paths 169 and 171, may cross one another.

Depending on a number of factors including, but not limited to, the positioning of the directional element 113, horizontal spacing (G) between the insulators 112, 114, the vertical spacing (Z) of the insulators 112, 114 above the plane 151, the dielectric constant of the directional element 113 and the insulators 112, 114 and other plasma processing parameters, the range of incident angles ($\theta$) as described above, is between about $+89°$ and about $-89°$, exclusive of $0°$.

The range of incident angles may be selected based upon an aspect ratio of a 3D feature on the substrate 138. For example, sidewalls 147 of a fin structure 144 having one or more material film layers formed thereon, having an exaggerated size for clarity of illustration, may be more uniformly treated by the ions 101 than with conventional plasma processing apparatuses and procedures. For example, by utilizing a bimodal ion distribution, only desired areas of the features may be modified as a result of shadowing effects and the ion trajectory. The processing apparatus 121 may be configured to perform heated implantation processes. The aspect ratio, which may be defined as the relationship between a pitch between the sidewalls 147 and a height of the sidewalls 147 extending from the substrate 138, may determine the trajectory at which the ions 101 are directed toward the sidewalls 147. In one embodiment, the trajectory of the ions 101 and the incident angle relative to the plane 151 may be selected to avoid contact with material below the sidewalls 147, for example, the substrate 138 in one embodiment, or an insulator in another embodiment. It is also contemplated that different angles and ion trajectories may be selected for different orientations of features disposed on the substrate. For example, treatment of a fin structure and treatment of a gate structure may utilize the same or different ion trajectories, materials, dosages, etc.

The above-described processing apparatus 100 can be controlled by a processor based system controller such as the controller 190. For example, the controller 190 may be configured to control flow of various precursor and process gases from gas sources and control processing parameters associated with directional ion implantation processes. The controller 190 includes the programmable central processing unit (CPU) 192 that is operable with the memory 194 and a mass storage device, an input control unit, and a display unit (not shown), such as power supplies, clocks, cache, input/output (I/O) circuits, and the like, coupled to the various components of the processing apparatus 100 to facilitate control of the substrate processing. The controller 190 also includes hardware for monitoring substrate processing through sensors in the processing apparatus 100, including sensors monitoring the substrate position and sensors configured to receive feedback from and control heating apparatus coupled to the processing apparatus 100. Other sensors that measure system parameters such as substrate temperature, chamber atmosphere pressure and the like, may also provide information to the controller 190.

To facilitate control of the processing apparatus 100 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. The support circuits 196 are coupled to the CPU 192 for supporting the processor in a conventional manner. Implantation and other processes are generally stored in the memory 194, typically as a software routine. The software routine may also be stored and/or executed by a second CPU (not shown) that is remotely located from the hardware being controlled by the CPU 192.

The memory 194 is in the form of computer-readable storage media that contains instructions, that when executed by the CPU 192, facilitates the operation of the apparatus 100. The instructions in the memory 194 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

As previously described, the plasma processing apparatus 100 is only one example of an apparatus that may be used. Other apparatus, such as pattern beams, electron beams (e.g., pulsed or continuous), raster scanning, and variable scanning apparatus may be used. Any other method of directionally implanting ions may also be used. According to certain aspects, one or more energetic particle beams may include a cylindrical shaped beam, a plurality of adjacent or overlapping cylindrical beams, or a ribbon shaped beam (e.g., a continuous rectangular shaped beam). The one or more energetic particle beams can be moved relative to the substrate 138 during processing and/or the substrate 138 can be moved relative to the energetic particle beam during processing. Different processing characteristics may be used, such as beam energy, beam angle, beam angle relative to the transfer direction of the substrate 138, and beam composition (e.g., gas ions), among other processing characteristics, may be utilized to implant one or more features or layers formed on the substrate 138.

Figure 2:
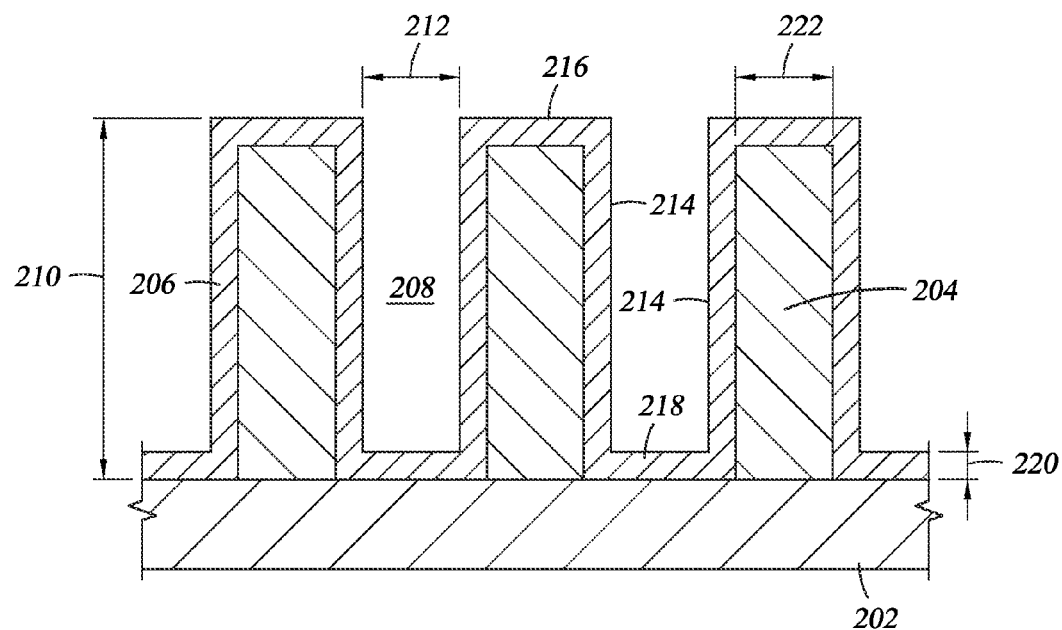
FIG. 2 illustrates a partial, cross-sectional view of a substrate with a film deposited thereon.

FIG. 2 illustrates a partial, cross-sectional view of a substrate 202 having a film 206 formed thereon. The substrate 202 may be a silicon material, such as monocrystalline silicon, or the substrate may be a silicon-on-insulator type substrate. In the illustrated embodiment, the substrate 202 is a silicon substrate having fin structures 204 formed thereon extending from the substrate 202. It is contemplated that any number of fin structures 204 may be formed on the substrate 202. The film 206 may be deposited over the substrate 202 and fin structures 204 and the film 206 may be formed from an insulating material. In one embodiment, the film 206 may be conformally deposited over the substrate 202. Suitable film deposition processes include chemical vapor deposition (CVD) processes, such as plasma enhanced chemical vapor deposition (PECVD) process, atomic layer deposition (ALD) processes, or epitaxial deposition processes. Examples of suitable film materials include one or more of a silicon nitride containing material, an oxide containing material, and aluminum oxide containing material, an amorphous silicon containing material, or a polysilicon containing material.

In one embodiment, the film 206 is a silicon nitride material deposited by an ALD process, which may be a low temperature ALD process. For example, the ALD process may be performed at temperatures between about 25° C. and about 450° C. The film may be deposited to a thickness 220 of between about 1 nm and about 30 nm, such as between about 2 nm and about 4 nm. Generally the silicon nitride film 206 exhibits low quality etch resistance, but may be modified by the methods described herein to improve etch selectivity of the film 206. In one embodiment, horizontally disposed portions 216, 218 of the film 206 may exhibit a greater material density relative to vertically disposed portions 214. It is believed that differing densities of the film 206 may influence subsequent ion implantation processes and may also influence etch selectivity of the film 206 due to modification profiles of the film 206 across different portions 216, 218 as a result of ion implantation into the film 206.

The fin structures 204 define an aspect ratio, for example a height 210 and a width 222. The height 210 may be between about 30 nm and about 90 nm, such as about 60 nm, and the width 222 may be between about 2 nm and about 20 nm, such as about 10 nm. The aspect ratio may be altered by the presence of the film 206 disposed on the fin structures 204. For example, the portion 216 of the film 206 may be disposed on a top of the fin structures 204, the portion 214 of the film 206 may be disposed on sidewalls of the fin structures 204 and the portion 218 of the film 206 may be disposed on the substrate 202 between adjacent fin structures 204. Generally the portions 216, 218 may be horizontally disposed on the substrate 202 and the portion 214 may vertically disposed adjacent the fin structure sidewalls. A trench 208 may be defined between adjacent fin structures 204 and the trench 208 may have a width 212. The width 212 may generally be between about 10 nm and about 30 nm, however other widths are contemplated depending upon desired feature characteristics. Generally, the dimensions of the fin structures 204 may be defined by the feature densities selected for device manufacturing at advanced nodes with reduced critical dimensions. As such, it is contemplated that the aspect ratio of the fin structures 204 and other dimensions, such as the width 212 of the trench 208, may influence subsequent directional ion implantation processes.

Figure 3:
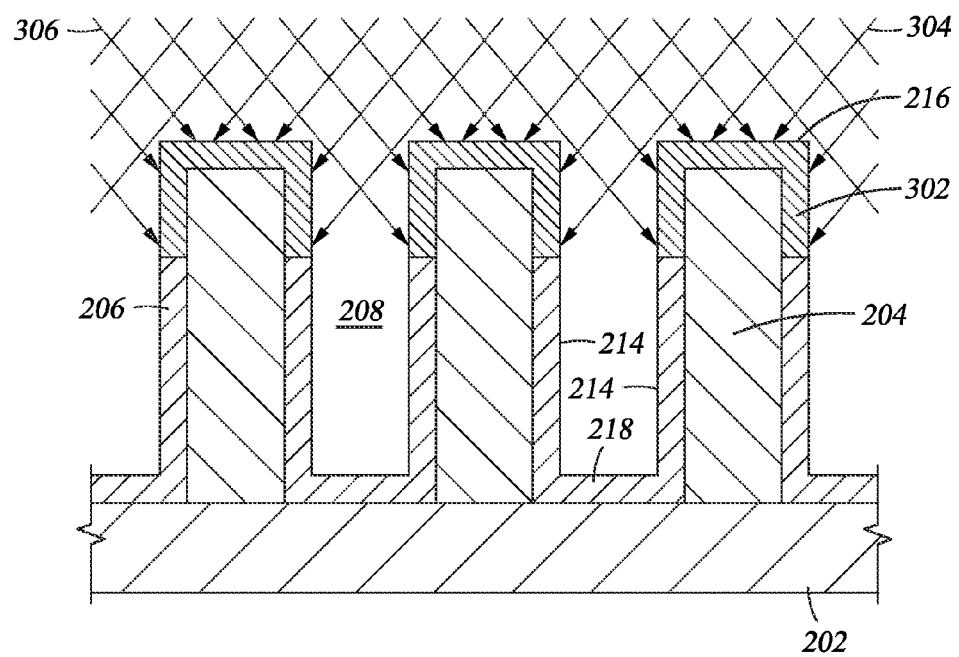
FIG. 3 is a partial, cross-sectional view of the substrate illustrating a directional implantation process performed on the substrate and the film of FIG. 2.

FIG. 3 is a partial, cross-sectional view of the substrate 202 of FIG. 2 illustrating a directional implantation process performed on the film 206. One or more directional ion implantation angles may be selected in response to the aspect ratio of the one or more fin structures 204. Ions directed toward the fin structures 204 may modify at least a portion of the film 206 to form a 3D hardmask 302. The directional implantation process may be a bi-directional process as shown in the illustrated embodiment, or the directional implantation process may be a unidirectional process. A bi-directional process may utilize at least two ion trajectories and a unidirectional process may utilize a single ion trajectory. In one embodiment, the bi-directional process may utilize similar implantation angles, but with different orientations (i.e. +/−). The directional ion implantation process accelerates ions towards the film 206 along the selected implantation trajectories defined by the angles and bombards the film 206 to implant ions therein.

For example, a first angle 304 may be selected to control exposure of the sidewalls 214 of the film 206 to the ions within the trench 208. Similarly, a second angle 306 may be selected to control exposure of the sidewalls 214 of the film 206 to the ion within the trench 208. The angles 304, 306, in combination with other processing variables, control the depth to which the ions are implanted in the film 206. The angles 304, 306 advantageously benefit from a shadowing effect of adjacent fin structures 204 to prevent implantation of ions below a desired position on the sidewalls 214 of the film 206. Generally, the first angle 304 may be between about +40° and about +70° and the second angle may be between about −40° and about −70°. Both the first angle 304 and the second angle 306 may be measured relative to a datum line oriented parallel to a horizontal surface of the substrate 202, which may be similar to the plane 151 illustrated in FIG. 1.

During the directional ion implantation process, ions propagate predominantly along the selected trajectories defined by the selected angles 304, 306 and bombard the film 206. The ion bombardment implants the ions within the film 206 to modify the film 206 by altering the physical composition of the film 206 and/or the chemical composition of the film 206. The degree to which the physical or chemical composition of the film 206 is modified may be determined by one or more variables, including the species of ion selected, the material properties of the film 206 being modified, the rotational orientation of the substrate 202, the temperature at which the ions are implanted, the concentration, or dosage, of the ion being implanted and the amount of energy with which the ions are implanted in the film 206.

The substrate 202 may be rotated to orient the substrate 202 in a first position. If desired, the substrate 202 may be rotated to a second position different from the first position for further directional ion implantation processing. The rotational orientation of the substrate 202 may be utilized to improve the implantation uniformity of ions in the film 206.

The temperature utilized to perform the ion implantation process may be between about 20° C. and about 1000° C., depending on thermal budgets of the materials present on the substrate 202. In one embodiment, the temperature may be between about 200° C. and about 500° C., such as between about 300° C. and about 400° C., for example, about 350° C. Utilizing an elevated temperature to perform a heated ion implantation process may improve incorporation of the ions into the film 206 by maintaining bond integrity of the film material. As a result, damage to the film 206 as a result of the ion implantation may be reduced or eliminated.

The ion dosage selected to incorporate ions in the film 206 may be configured to predominantly modify surface regions of the film 206 to avoid implantation in or damage to the underlying fin structures 204. The ion dosage is dependent upon the species of ion being utilized and the energy with which the ions are implanted, however, the dosage may be greater than about 1E15 (ions/cm$^3$). In one embodiment, the dosage of carbon ions (subject to the influence of other processing variables) may be between about 5E15 (ions/cm$^3$) and about 1E22 (ions/cm$^3$), such as about 1E16 (ions/cm$^3$). Other ions, such as boron ions and silicon ions, may be implanted with similar dosages.

The implantation energy selected to implant the ions in the film 206 may be configured to control the depth of which the ions are implanted into the film 206. The implantation energy and depth of ion penetration into the film 206 is influenced by the species of ion selected for incorporation into the film 206, however, the implantation energy may be between about 0.5 keV and about 8.0 keV, such as between about 1 keV and about 3 keV. In one embodiment, the implantation of carbon ions (subject to the influence of other processing variables) may be between about 0.5 keV and about 1.5 keV. Other ions, such as boron ions and silicon ions, may be implanted utilizing the energy ranges described above.

The directional ion implantation process may be performed one or more times to form the 3D hardmask 302. In one embodiment, the directional ion implantation process may be repeated. For example, the directional ion implantation process may be performed two or more times or even four or more times. Generally, each subsequent repetition of the directional ion implantation process may utilize one or more different processing variables from the previous directional ion implantation process. For example, the directional ion implantation process may be repeated three times utilizing a single ion species, but the implantation energy or the ion dosage may be changed for each subsequent implantation process. While it may be desirable in certain embodiments to repeat the implantation process with differing processing variables, it is contemplated that the repeated processes may utilize the same or similar variables.

Figure 4:
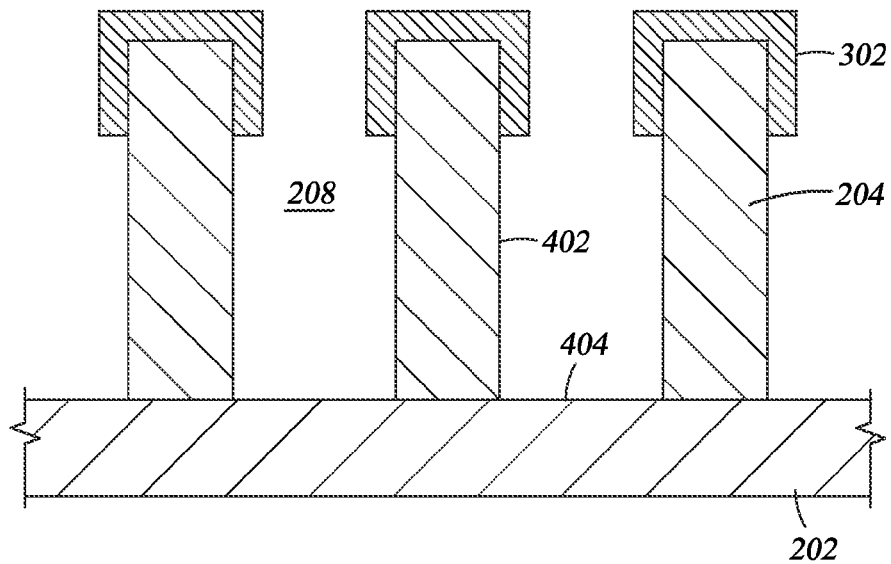
FIG. 4 is a partial, cross-sectional view of the substrate illustrating a 3D hardmask formed on the substrate of FIG. 3.

FIG. 4 is a partial, cross-sectional view of the substrate 202 illustrating the 3D hardmask 302 formed on the substrate 202 of FIG. 3 after a film removal process. As described above, the 3D hardmask 302 is modified by the directional ion implantation process to improve the etch resistance and selectivity of the 3D hardmask 302 relative to unmodified portions of the film 206 (See FIG. 3). The unmodified film 206 may be subjected to an etching process to selectively remove the film 206 from the substrate 202 and the fin structures 204. Removal of the film 206 exposes a sidewall 402 of the fin structure 204 and a bottom surface 404 of the trench 208.

The etching process utilized to selectively remove unmodified portions of the film 206 may be a wet etching process, a dry etching process, a soft plasma etching process or a directional etching process, among other suitable processes. In one embodiment, a wet etching process utilizing a fluorine containing material, such as a hydrogen fluoride, may be utilized to remove the film 206. In another embodiment, a low temperature plasma energized by an ion beam may be utilized to remove the unmodified portions of film 206. It is contemplated that the type of etching process and the associated etch chemistry may be configured to remove predominantly the unmodified portions of the film 206 such that the 3D hardmask 302, the substrate 202 and fin structures 204 are not etched to a significant degree. Accordingly, the 3D hardmask 302 remains disposed on the fin structures 204 post etch.

Figure 5:
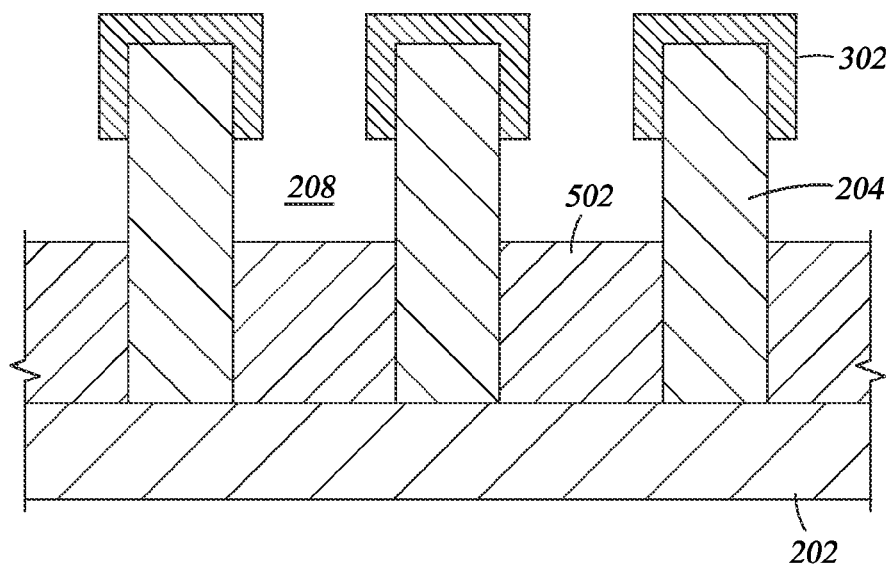
FIG. 5 is a partial, cross-sectional view of the substrate illustrating an insulator layer formed on the substrate of FIG. 4.

FIG. 5 is a partial, cross-sectional view of the substrate 202 of FIG. 4 illustrating the result of an insulator layer deposition process. In one embodiment, subsequent to formation of the 3D hardmask 302 and prior to performing the insulator deposition process, a fin oxidation process may be performed. In this embodiment, portions of the fin structures 204 not protected by the 3D hardmask 302 may be oxidized. The oxidation process may be a thermal oxidation process or an angled oxygen implantation process. The angled oxygen implantation process may be a heated implantation or an unheated process followed by a post implantation annealing process.

An insulator layer 502 may be deposited on the substrate 202 to isolate adjacent fin structures 204 from one another to reduce or eliminate current leakage. The insulator deposition process may be any suitable deposition process, and in one embodiment, a directional deposition process may be utilized to oxidize desired portions of the substrate 202 and fin structures 204. Generally, the insulator layer 502 may be deposited below the 3D hardmask 302. The insulator layer 502 is intended to be representative of an oxidizing material, however, other suitable insulating materials compatible with integration schemes such as, fin isolation schemes, gate-all-around schemes, and the like may be utilized. It is also contemplated that the insulator layer 502 may already be present on the substrate 202 prior to formation of the 3D hardmask 302.

Figure 6A:
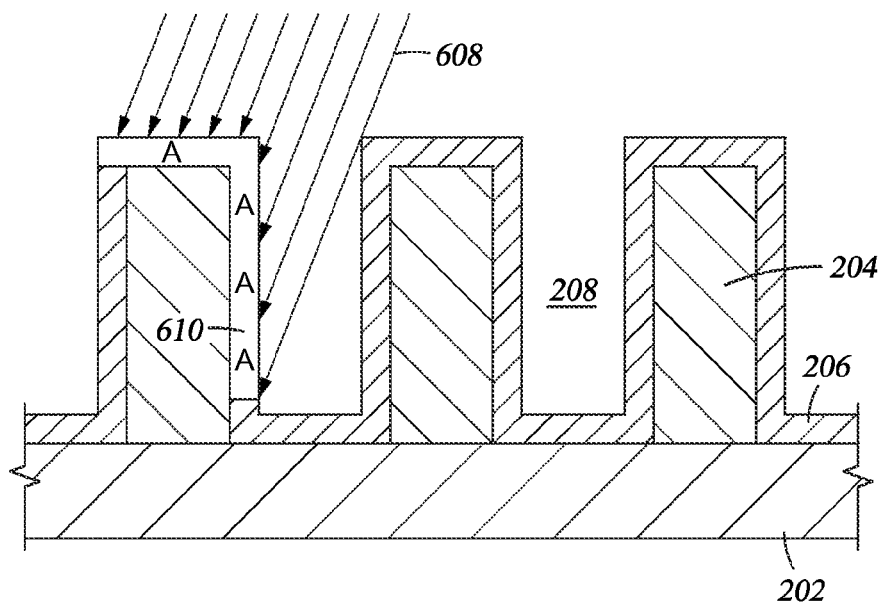
FIGS. 6A-6C are partial, cross-sectional views of a substrate illustrating a directional implantation sequence.
Figure 6B:
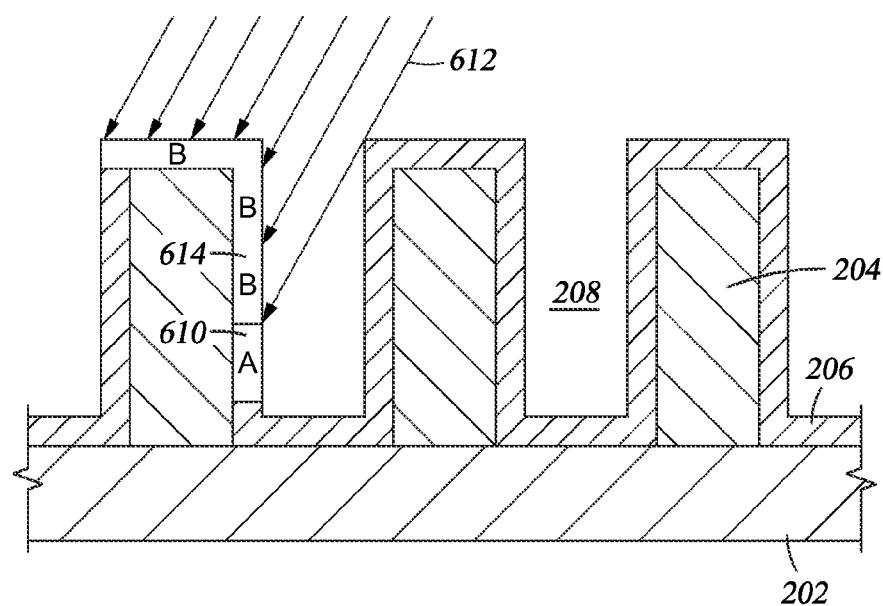
Figure 6C:
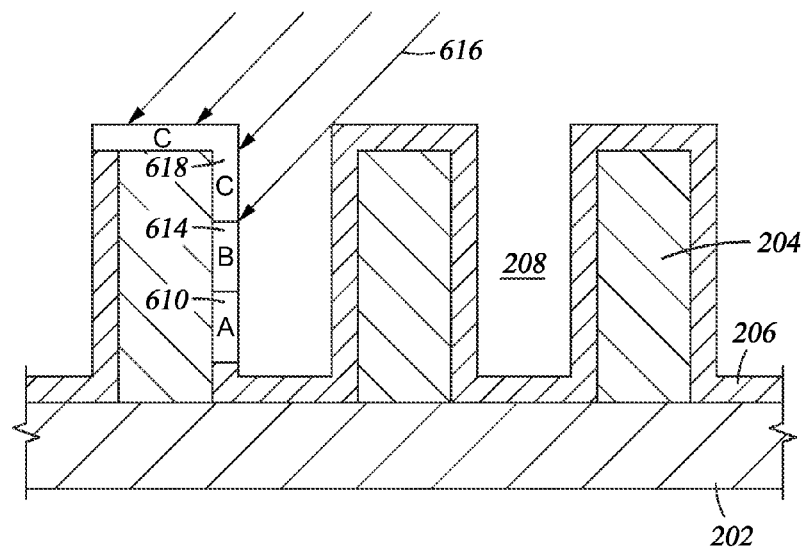

FIGS. 6A-6C are partial, cross-sectional views of the substrate 202 illustrating a directional implantation sequence according to certain embodiments described herein. Although illustrated as a unidirectional implantation sequence, it is contemplated that the embodiments described with regard to FIGS. 6A-6C may be utilized in a bi-directional implantation sequence or may be utilized in combination with both unidirectional and bi-directional implantation sequences. Various directional implantation processing variables described above with regard to FIG. 3 may be beneficially incorporated, where desirable, into the embodiments described below.

FIG. 6A illustrates a first directional ion implantation operation adapted to modify a first region 610. The first implantation operation may utilize a first trajectory defined by a first angle 608 which is determined by the position of the first region 610 and an aspect ratio of the fin structures 204 having the film 206 formed thereon. Ions are accelerated along the first trajectory at the first angle 608 relative to the plane 151 (See FIG. 1) towards the film 206. In one embodiment, the first implantation operation may utilize a first ion species to modify the first region 610 with a dopant profile A having unique physical and chemical characteristics as a result of the film modification. The dopant profile A may be unique to the type of ion species utilized, the dosage, the implantation energy, and other processing variables selected when performing the first implantation operation. In one embodiment, the dopant profile A may be configured to provide a unique selective etch signature relative to other regions of the film 206.

FIG. 6B illustrates a second directional ion implantation operation adapted to modify a second region 614. The second implantation operation may utilize a second trajectory defined by a second angle 612 different from the first angle 608 which is determined by the position of the second region 614 and an aspect ratio of the fin structures 204 having the film 206 formed thereon. Ions are accelerated along the second trajectory at the second angle 612 relative to the plane 151. In one embodiment, the second implantation operation may utilize a second ion species to modify the second region 614 with a dopant profile B having unique physical and chemical characteristics as a result of the film modification. The dopant profile B may be unique to the type of ion species utilized, the dosage, the implantation energy, and other processing variables selected when performing the second implantation operation. In one embodiment, the dopant profile B may be configured to provide a unique selective etch signature relative to other regions of the film 206, such as the first region 610.

FIG. 6C illustrates a third directional ion implantation operation adapted to modify a third region 618. The third implantation operation may utilize a third trajectory defined by a third angle 616 different from the first angle 608 and the second angle 612 which is determined by the position of the third region 618 and an aspect ratio of the fin structures 204 having the film 206 formed thereon. Ions are accelerated along the third trajectory at the third angle 616 relative to the plane 151. In one embodiment, the third implantation operation may utilize a third ion species to modify the third region 618 with a dopant profile C having unique physical and chemical characteristics as a result of the film modification. The dopant profile C may be unique to the type of ion species utilized, the dosage, the implantation energy, and other processing variables selected when performing the third implantation operation. In one embodiment, the dopant profile C may be configured to provide a unique selective etch signature relative to other regions of the film 206, such as the first region 610 and the second region 614.

The first, second and third directional ion implantation operations may be performed in any desired order and the position of the regions 610, 614, 618 may be predominantly determined by the angles 608, 612, 616 defining the trajectories utilized to modify the film 206 via dopant implantation. The dopant profiles A, B, C may have similar or different etch characteristics depending upon the numerous processing variables implicit in forming the regions 610, 614, 618. Etch chemistries utilized to ultimately remove either unmodified regions of the film 206 adjacent the regions 610, 614, 618 or the regions 610, 614, 618 themselves may be selected, at least in part, in response to the dopant profiles A, B, C to enhance etch selectivity. The first, second and third directional ion implantation operations generally provide for improved localized etch selectivity between modified and unmodified films. It is believed that the embodiments described above may be especially advantageous in advanced integration and advanced patterning processes, such as gate-all-around integration schemes.

Figure 7:
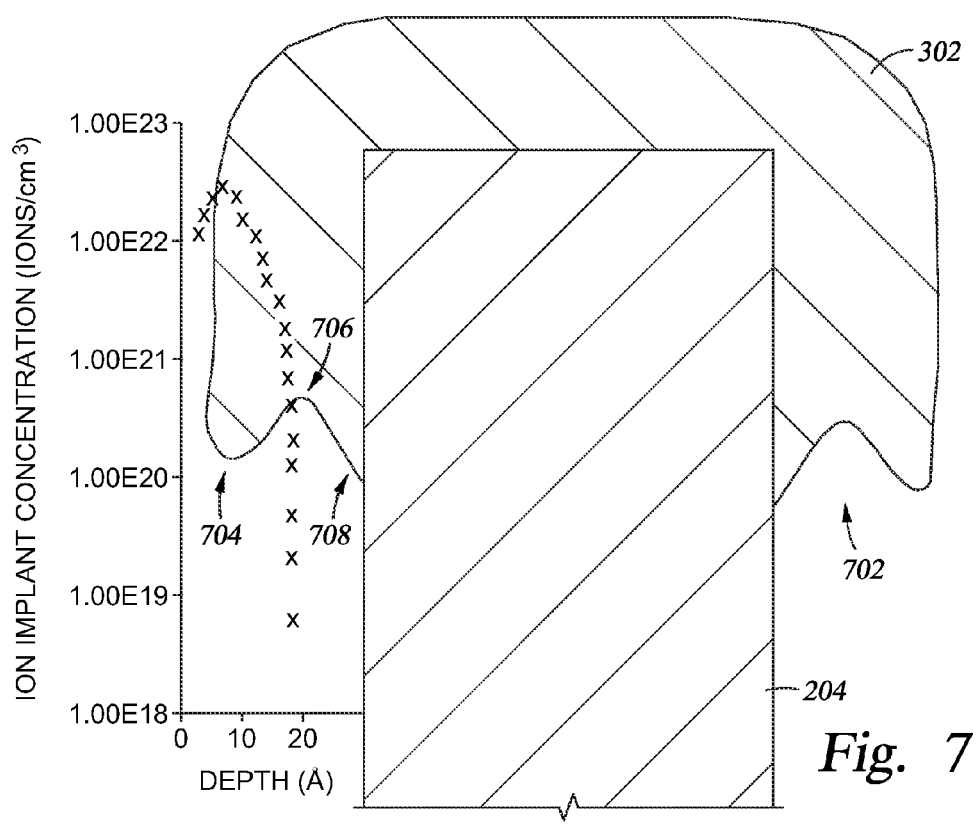
FIG. 7 illustrates a partial, cross-sectional view of a 3D hardmask formed on a fin structure and a graphically represented dopant gradient profile.

FIG. 7 illustrates a partial, cross-sectional view of the 3D hardmask 302 formed on one of the fin structures 204 and a graphically represented dopant gradient profile. The 3D hardmask 302, which is modified by the directional ion implantation embodiments described above, includes an outer region 704, and intermediate region 706 and an inner region 708. The inner region 708 may be defined as a region of the 3D hardmask 302 disposed adjacent the sidewalls and top surface of the fin structure 204. The outer region 704 may be a "skin" region of the 3D hardmask 302 disposed furthest from the fin structure 204. The intermediate region 706 may be defined as a portion of the 3D hardmask disposed between the inner region 708 and the outer region 704.

In certain embodiments, a dopant gradient profile may be formed in the 3D hardmask 302 as a result of the directional ion implantation processes described above. The dopant gradient profile may generally be defined as a graduated compositional change through a width or thickness of the 3D hardmask 302. For example, physical and/or chemical characteristics of the 3D hardmask 302, modified by the implantation of ions therein, may differ in the outer region 704, the intermediate region 706 and the inner region 708 relative to one another. It is contemplated that the dopant gradient profile may define etch selectivity characteristics of the regions 704, 706, 708 resulting in the formation of an engineered feature 702, such as a notch formed in the 3D hardmask 302. The engineered feature 702 may also be formed in other shapes depending upon the dopant gradient profile and the processing variables utilized to implant the 3D hardmask 302.

In the illustrated example, the outer region 704 may be implanted to a depth of up to about 10 Å, the intermediate region 706 may be implanted to a depth of between about 10 Å and about 20 Å, and the inner region 708 may be implanted to a depth of the between about 20 Å and about 30 Å. The depth of ion implantation into the 3D hardmaks 302 may be influenced by one or a combination of the processing variables. Generally a concentration of ions implanted within the 3D hardmask may decrease from the outer region 704 to the inner region 708. The inner region 708 may even be devoid of implanted ions to prevent modifying or damaging the fin structure 204. For example, the implanted ion concentration in the outer region 704 may be between about 1E21 (ions/cm³) and about 1E23 (ions/cm³), the ion concentration in the intermediate region 706 may be between about 1E19 (ions/cm³) and about 1E21 (ions/cm³), and the implanted ion concentration in the inner region 708 may be less than about 1E19 (ions/cm³). It is contemplated that other implanted ion concentrations may be achieved depending upon the types of materials utilized and the processing variables used.

In embodiments where the inner region 708 is devoid or predominantly devoid of implanted ions, the material characteristic of the inner region 708 may be determined by the deposition process utilized to form the 3D hardmask 302. For example, if an ALD or plasma enhanced atomic layer deposition (PEALD) process was utilized the deposit the 3D hardmask, a density of the material in the inner region 708 may be greater on a top surface of the fin structure 204 as opposed to a sidewall of the fin structure 204. Generally, the density of the regions 704, 706, 708 may influence etch selectivity characteristics and the dopant gradient profile of the 3D hardmask, in combination with the film densities, may be utilized to improve selectivity of the 3D hardmask.

In one embodiment, multiple ion implantation processes may be utilized to form a 3D hardmask with an engineered feature 702. In the illustrated example of FIG. 7, the engineered feature 702 shaped like a notch is formed in response to the etching of the 3D hardmask 302 having a dopant grandient profile. Exemplary processing variables include two or more directional ion implantation processes, one or more ion species, implant energies between about 0.5 keV and about 3 keV, dosages between about 5E15 and about 1E17, implant angles of between about +/−30° and about +/−80°, and temperatures of between about 200° C. and about 500° C. After the ion implantation processes have been performed to generate a dopant gradient profile in the 3D hardmask 302, an etching process may be performed to remove unmodified films which may exist on the fin structure 204. During the etching process, the engineered feature 702 may be formed in response to the etch rates and etch selectivity of the etchant to the dopant concentration of the 3D hardmask 302 at various regions of the 3D hardmask 302.

In summation, methods and materials formed utilizing directional ion implantation processes are described herein. The directional ion implantation processes are suitable for improving the creation of hardmask materials with improved etch resistance and etch selectivity. The improved etching characteristics enhance processing performance utilized in advanced integration schemes and the like.

While the foregoing is directed to embodiments of the present disclosure, other and further embodiments of the disclosure may be devised without departing from the basic scope thereof, and the scope thereof is determined by the claims that follow.

What is claimed is:

1. A method of manufacturing a device structure, comprising:
   depositing a film on a substrate having fin structures formed thereon;
   selecting an ion implantation angle in response to an aspect ratio defined by the one or more fin structures;
   selecting an ion dosage concentration and an implantation energy configured to modify compositional characteristics of the film;
   selecting an implantation temperature;
   directing ions toward the film along a trajectory defined by the angle and bombarding at least one surface of the film with the ions to form a modified portion of the film; and
   removing an unmodified portion of the film from the substrate.

2. The method of claim 1, further comprising:
   repeating, one or more times, the selecting an ion implantation angle, the selecting an ion dosage concentration and implantation energy, the selecting an implantation temperature, and the directing ions and bombarding the film to generate a dopant gradient profile in the film.

3. The method of claim 2, wherein at least one of the selecting an ion implantation angle, the selecting an ion dosage concentration and implantation energy, and the selecting an implantation temperature is changed for each successive one or more repetitions.

4. The method of claim 2, wherein the dopant gradient profile is configured to change an etch rate of one or more regions of the film.

5. The method of claim 1, further comprising:
   oxidizing exposed surfaces of the substrate and fin structures or depositing an insulator material over the substrate after the removing an unmodified portion of the film from the substrate.

6. The method of claim 1, wherein the film is deposited by an atomic layer deposition process and a top surface of the film has a density greater than a sidewall of the film.

7. The method of claim 6, wherein the film comprises one or more of a silicon nitride containing material, an oxide containing material, and aluminum oxide containing material, an amorphous silicon containing material, or a polysilicon containing material.

8. The method of claim 1, wherein the implantation temperature is between about 200° C. and about 500° C.

9. The method of claim 1, wherein the dosage concentration is greater than about 5E15 (ions/cm³).

10. The method of claim 1, wherein the selecting an ion implantation angle comprises selecting a first angle between about +40° and about +70° and selecting a second angle between about −40° and about −70°.

11. The method of claim 1, wherein the ions comprise one or more of He+, $H_3$+, $H_2$+, H+, Ne+, F+, C+, $CF_x$+, $CH_x$+, $C_xH_y$, N+, B+, Si+, SiH+, $SiH_2$+, $SiH_3$+, BF+, $BF_2$+, $B_2H_x$+, Xe+ and molecular silicon, carbon, boron, or boron carbide ions.

12. A method of manufacturing a device structure, comprising:
   depositing a silicon nitride film on a silicon substrate having one or more fin structures formed thereon;
   selecting an ion implantation angle in response to an aspect ratio defined by the one or more fin structures;
   selecting an ion dosage concentration greater than about 5E15 (ions/cm³) and an implantation energy configured to modify compositional characteristics of the silicon nitride film;
   selecting an implantation temperature between about 15° C. and about 400° C.;
   directing ions toward the silicon nitride film along a trajectory defined by the angle and bombarding sidewalls and a top surface of the silicon nitride film with the ions to form a modified cap portion of the silicon nitride film;
   etching an unmodified portion of the silicon nitride film from the silicon substrate using a fluorine containing etching process; and oxidizing exposed surfaces of the silicon substrate and fin structures.

13. The method of claim 12, further comprising:
repeating one or more times the selecting an ion implantation angle, the selecting an ion dosage concentration and implantation energy, the selecting an implantation temperature, and the accelerating ions and bombarding the film to generate a dopant gradient profile in the silicon nitride film.

14. The method of claim 13, wherein at least one of the selecting an ion implantation angle, the selecting an ion dosage concentration and implantation energy, and the selecting an implantation temperature is changed for each successive one or more repetitions.

15. The method of claim 13, wherein the dopant gradient profile is configured to change an etch rate of one or more regions of the silicon nitride film.

16. The method of claim 15, wherein the modified cap portion has a notched region in response to the dopant gradient profile.

* * * * *